(12) United States Patent
Wang

(10) Patent No.: US 9,379,699 B2
(45) Date of Patent: Jun. 28, 2016

(54) SWITCH DRIVER WITH A LOW-COST CROSS-CONDUCTION-PREVENTING CIRCUIT

(71) Applicant: Balanstring Technology, LLC, Katy, TX (US)

(72) Inventor: Wenwei Wang, Katy, TX (US)

( * ) Notice: Subject to any disclaimer, the term of this patent is extended or adjusted under 35 U.S.C. 154(b) by 0 days.

(21) Appl. No.: 14/759,402

(22) PCT Filed: Nov. 26, 2014

(86) PCT No.: PCT/US2014/067636
§ 371 (c)(1),
(2) Date: Jul. 6, 2015

(87) PCT Pub. No.: WO2016/073012
PCT Pub. Date: May 12, 2016

(65) Prior Publication Data
US 2016/0134272 A1   May 12, 2016

Related U.S. Application Data

(60) Provisional application No. 62/076,956, filed on Nov. 7, 2014.

(51) Int. Cl.
H03L 5/00 (2006.01)
H03K 17/16 (2006.01)
H03K 19/0185 (2006.01)

(52) U.S. Cl.
CPC ...... *H03K 17/162* (2013.01); *H03K 19/018521* (2013.01)

(58) Field of Classification Search
None
See application file for complete search history.

(56) References Cited

U.S. PATENT DOCUMENTS

| | | | | | |
|---|---|---|---|---|---|
| 5,097,149 | A * | 3/1992 | Lee | ............... | H03K 19/09429 326/27 |
| 5,281,862 | A | 1/1994 | Ma | | |
| 5,510,731 | A * | 4/1996 | Dingwall | ......... | H03K 3/356113 326/63 |
| 5,751,171 | A * | 5/1998 | Ngo | .............. | G11B 5/022 327/110 |
| 5,781,046 | A * | 7/1998 | Ngo | .............. | G11B 5/022 327/110 |
| 5,883,538 | A * | 3/1999 | Keeth | ................ | G11C 8/08 326/81 |
| 5,896,058 | A * | 4/1999 | Sanzo | ................ | H03K 17/666 327/111 |
| 6,407,594 | B1 * | 6/2002 | Milazzo | ............... | H02M 1/08 327/112 |
| 6,459,325 | B1 * | 10/2002 | Hall | ................... | H03K 4/00 326/27 |
| 6,538,479 | B2 * | 3/2003 | Bellomo | ........... | H03K 17/04123 327/108 |
| 6,593,622 | B2 | 7/2003 | Kinzer et al. | | |
| 6,605,982 | B2 * | 8/2003 | Callahan, Jr. | ............ | G05F 3/205 327/535 |
| 7,187,226 | B2 | 3/2007 | Audy | | |
| 7,560,972 | B1 * | 7/2009 | Tiew | ................ | H03K 19/01721 326/81 |
| 7,659,754 | B2 * | 2/2010 | Thiele | .............. | H03K 17/04123 323/284 |
| 7,741,882 | B1 * | 6/2010 | Ray | ................. | H03K 19/018521 326/83 |
| 8,471,606 | B2 * | 6/2013 | Clements | .......... | H03K 3/356113 327/108 |
| 8,558,584 | B2 * | 10/2013 | Draxelmayr | ........... | H02M 3/337 327/108 |
| 8,866,500 | B2 * | 10/2014 | Kremin | .............. | G01R 27/2605 324/658 |
| 2003/0067728 | A1 * | 4/2003 | Feldtkeller | ........ | H03K 17/08122 361/100 |
| 2010/0060222 | A1 * | 3/2010 | Kezobo | .................. | G01R 31/42 318/490 |

\* cited by examiner

*Primary Examiner* — Lincoln Donovan
*Assistant Examiner* — Khareem E Almo
(74) *Attorney, Agent, or Firm* — Kevin Roe

(57) ABSTRACT

A driver for a power transistor switch comprising a FET complementary output stage which is driven by another FET complementary pre-driver stage which is further driven by an input-buffer and level-shifter stage. The pre-driver stage includes a current-limiting and cross-delaying circuit which is inserted in between drains terminals of a complementary FET pair. The current-limiting and cross-delaying circuit limits shoot-current at the pre-driver stage; and in conjunction with the FET pair and the input-buffer and level-shifter stage, it is adapted to delay turning on one complementary output FET until after the other complementary output FET is turned off, thereby preventing cross conduction at the output stage.

20 Claims, 8 Drawing Sheets

SWITCH DRIVER WITH A LOW-COST CROSS-CONDUCTION-PREVENTING CIRCUIT

TECHNICAL FIELD

The present invention relates in general to a driver circuit for driving a power transistor switch. And more particularly, the present invention relates to a switch driver circuit with a complementary output in which cross conduction is prevented or minimized by use of a current-limiting and cross-delaying circuit.

BACKGROUND ART

A switch driver, also frequently referred to as a gate driver, is a circuit that can accept a typically low-current, logic-voltage-level external input signal, and then level-shift and amplify the input signal to produce a higher-current and usually wider voltage-level output, which is coupled to drive the gate of a power transistor (such as a power metal-oxide-semiconductor-field-effect-transistor (MOSFET), or an insulated-gate-bipolar-transistor (IGBT)), thereby switching ON/OFF the power transistor at high speeds. Because of intrinsic parasitic capacitances, a power transistor is considered a capacitive load for a switch driver, which essentially charges or discharges the power transistor during switching transitions. A switch driver can also be used to drive other types of equivalent capacitive loads, such as digital bus lines.

It is very common for a switch driver to comprise a complementary or totem-pole output that is based on a p-channel field-effect-transistor (FET) at the top and an n-channel FET on the bottom with drain terminals of the 2 FETs being coupled to form a common output node. FIG. 1 illustrates a typical prior-art switch driver 100 comprising: a p-channel FET 101 including a gate terminal, a source terminal, and a drain terminal, wherein the source terminal is coupled to an output-drive power supply $V_{DRIVE}$; an n-channel FET 102 including a gate terminal, a source terminal, and a drain terminal, wherein the source terminal is coupled to a ground potential relative to the $V_{DRIVE}$, and wherein the drain terminal is coupled to the drain terminal of the FET 101 thereby forming a complementary output node which is operable to be coupled to drive an external power transistor switch 130 (via an optional gate resistor (not shown), if it is necessary to reduce ringing introduced by parasitic lead inductance); a pre-driver circuit 110, powered by the $V_{DRIVE}$, and operable to be coupled to drive the gate terminals of the FETs 101 and 102 by switching one FET on while switching the other FET off during a switching transition; an input-buffer and level-shifter circuit 120, being powered by both a logic-voltage-level power supply $V_{LOGIC}$ and the $V_{DRIVE}$, to buffer and level-shift an external input signal at node 150 from $V_{LOGIC}$ level to $V_{DRIVE}$ level, and coupled to drive the pre-driver circuit 110. If during a switching transition, both the FETs 101 and 102 are partially or completely turned on simultaneously by the pre-driver circuit 110, cross conduction occurs, and a relatively large momentary shoot-through current runs through the FETs 101 and 102, resulting in low driving efficiency and potentially overheating the prior-art switch driver 100. Therefore, the prior-art switch driver 100 usually contains complicated circuits to minimize or hopefully eliminate cross conduction in the complementary output when the prior-art switch driver 100 operates within a specified junction temperature range.

There are switch driver designs that can minimize or prevent cross conduction at complementary outputs by complicated logic circuits and/or timing circuits. U.S. Pat. No. 6,538,479 (Bellomo et al.) discloses a switch driver circuit, which includes an adaptive anti-cross-conduction mechanism based on two power-on detectors, each of which is coupled to a respective complementary-output FET; when a power-on detector detects that a corresponding FET is still on, the switch driver circuit prohibits the other FET from being turned on.

SUMMARY OF INVENTION

Technical Problem

All known prior-art cross-conduction-preventing mechanisms implemented in switch drivers are considerably complicated in design, and significantly costly to produce, either in discrete modules or in integrated circuits (ICs). Usually, each of the complementary-output FETs needs to be separately driven by a plurality of stages of pre-drivers. And a complicated timing circuit and/or a complicated logic circuit (based on comparator(s), or sensors/detectors, and so forth) are required to implement a reliable cross-conduction-preventing feature. Subsequently, it is relatively expensive to produce a high-performing switch driver, and it is even more challenging to integrate a single or a plurality of high-performing switch drivers together with other major circuit functions on the same IC.

Solution to Problem

In one embodiment of the invention, a driver for a power transistor switch comprises: a first p-channel FET including a gate terminal, a source terminal, and a drain terminal, wherein the source terminal is coupled to an output-drive power supply $V_{DRIVE}$; a first n-channel FET including a gate terminal, a source terminal, and a drain terminal, wherein the source terminal is coupled to a ground potential relative to the $V_{DRIVE}$, and wherein the drain terminal is coupled to the drain terminal of the first p-channel FET thereby forming a complementary output node which is operable to be coupled to drive the power transistor switch; a second p-channel FET including a gate terminal, a source terminal, and a drain terminal, wherein the source terminal and the drain terminal are respectively coupled to the source terminal and the gate terminal of the first p-channel FET; a second n-channel FET including a gate terminal, a source terminal, and a drain terminal, wherein the source terminal and the drain terminal are respectively coupled to the source terminal and the gate terminal of the first n-channel FET; a current-limiting and cross-delaying circuit including a first node and a second node, further comprising at least one resistor, and wherein the first node is coupled to the drain terminal of the second p-channel FET, and wherein the second node is coupled to the drain terminal of the second n-channel FET, to reduce current flowing from the first node to the second node thereby limiting shoot-through current when both the second p-channel FET and the second n-channel FET are momentarily turned on during a switching transition, and delaying turning on the first p-channel FET when the first n-channel FET is being turned off, and delaying turning on the first n-channel FET when the first p-channel FET is being turned off; and an input-buffer and level-shifter circuit, being powered by both a logic-voltage-level power supply $V_{LOGIC}$ and the $V_{DRIVE}$, to buffer and level-shift an external input signal from $V_{LOGIC}$ level to $V_{DRIVE}$ level, and coupled to drive the gate terminals of the second p-channel FET and the second n-channel FET, and in conjunction with the current-limiting and cross-delaying circuit, to turn off the first p-channel FET before turning on the first n-channel FET thereby preventing cross conduction, and to turn off the first n-channel FET before turning on the first p-channel FET thereby preventing cross conduction. The at least one resistor may alternatively be constructed utilizing the drain-to-source turn-on resistance of a FET. In other embodiments of the invention, in addition to the at least one resistor, the current-limiting and cross-delaying circuit may comprise any combination of the following: a single resistor or a plurality of resistors; a single diode or a plurality of diodes; and a single transistor or a plurality of transistors.

In one embodiment, the input-buffer and level-shifter circuit further comprises: a third p-channel FET including a gate terminal, a source terminal, and a drain terminal, wherein the source terminal is coupled to the $V_{DRIVE}$, and wherein the drain terminal is coupled to the gate terminal of the second p-channel FET, and wherein the gate terminal is coupled to the second node of the current-limiting and cross-delaying circuit; a third n-channel FET including a gate terminal, a source terminal, and a drain terminal, wherein the drain terminal is coupled to the drain terminal of the third p-channel FET, and wherein the source terminal is coupled to the ground potential; an input buffer, being powered by the $V_{LOGIC}$, and including an input terminal coupled to the external input signal, and including an output terminal coupled to the gate terminal of the third n-channel FET; an inverter, being powered by the $V_{LOGIC}$, and including an input terminal coupled to the output terminal of the input buffer, and including an output terminal coupled to the gate terminal of the second n-channel FET.

In another embodiment of the invention, a driver for a power transistor switch comprises: a first p-channel FET including a gate terminal, a source terminal, and a drain terminal, wherein the source terminal is coupled to an output-drive power supply $V_{DRIVE}$; a first n-channel FET including a gate terminal, a source terminal, and a drain terminal, wherein the source terminal is coupled to a ground potential relative to the $V_{DRIVE}$, and wherein the drain terminal is coupled to the drain terminal of the first p-channel FET thereby forming a complementary output node which is operable to be coupled to drive the power transistor switch; a second p-channel FET including a gate terminal, a source terminal, and a drain terminal, wherein the source terminal and the drain terminal are respectively coupled to the source terminal and the gate terminal of the first p-channel FET; a second n-channel FET including a gate terminal, a source terminal, and a drain terminal, wherein the source terminal and the drain terminal are respectively coupled to the source terminal and the gate terminal of the first n-channel FET; a current-limiting and cross-delaying circuit including a first node and a second node, further comprising at least one resistor, and wherein the first node is coupled to the drain terminal of the second p-channel FET, and wherein the second node is coupled to the drain terminal of the second n-channel FET, to reduce current flowing from the first node to the second node thereby limiting shoot-through current when both the second p-channel FET and the second n-channel FET are momentarily turned on during a switching transition, and delaying turning on the first p-channel FET when the first n-channel FET is being turned off, and delaying turning on the first n-channel FET when the first p-channel FET is being turned off; and an input-buffer circuit, being powered by the $V_{DRIVE}$, to buffer and amplify an external input signal, and coupled to drive the gate terminals of the second p-channel FET and the second n-channel FET, and in conjunction with the current-limiting and cross-delaying circuit, to turn off the first p-channel FET before turning on the first n-channel FET thereby preventing cross conduction, and to turn off the first n-channel FET before turning on the first p-channel FET thereby preventing cross conduction.

Advantageous Effects of Invention

It is an advantageous effect of the invention to achieve a switch driver with a low-cost cross-conduction-preventing circuit; wherein a p-channel FET and an n-channel FET essentially forms a complementary pre-driver circuit with a current-limiting and cross-delaying circuit inserted in between their drain terminals, so that cross conduction of the complementary output can be prevented at low cost without compromising the performance of the switch driver; and the current-limiting and cross-delaying circuit can comprise a passive element as simple as a single resistor.

Another advantageous effect of the invention is a simple implementation of an input-buffer and level-shifter circuit in conjunction with the current-limiting and cross-delaying circuit, thereby further reducing the cost to build the switch driver without compromising the performance of the switch driver.

Still another advantageous effect of the invention is the feasibility of utilizing FETs only (no bipolar-junction-transistors (BJTs)) to implement the switch driver thereby achieving essentially zero quiescent power consumption.

Other advantages and benefits of the invention will become readily apparent upon further review of the following drawings.

BRIEF DESCRIPTION OF THE DRAWINGS

For a more complete understanding of the invention, reference is now made to the following descriptions taken in conjunction with the accompanying drawings.

FIG. 3, illustrates a 0-to-1 switching process, in accordance with one embodiment of the invention.

FIG. 3, illustrates a 1-to-0 switching process, in accordance with one embodiment of the invention.

MODES FOR CARRYING OUT THE INVENTION

Figure 1:
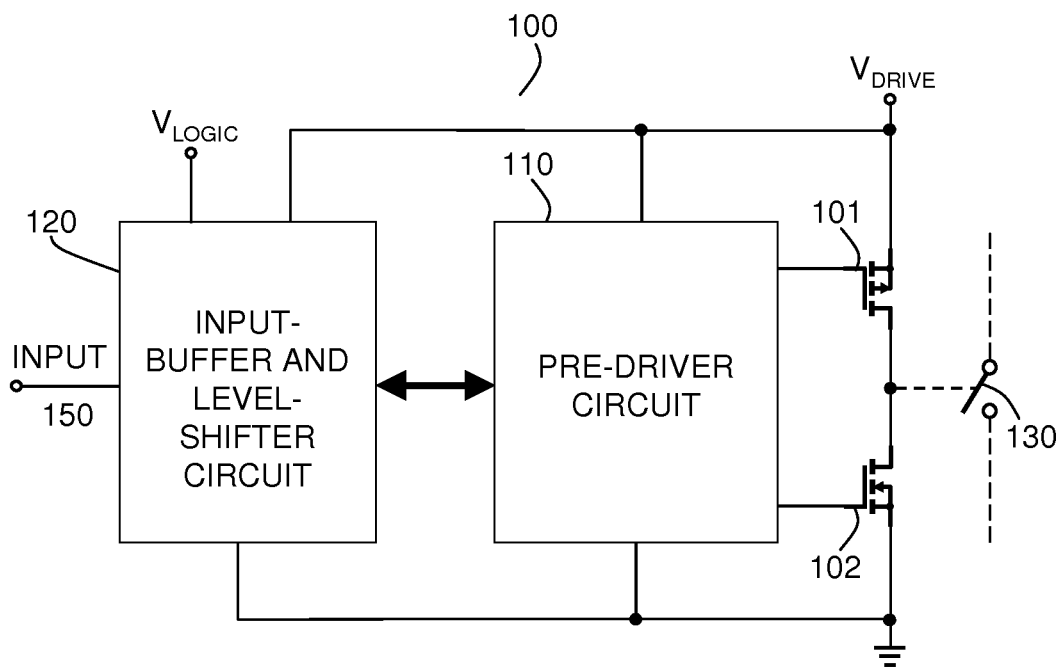
FIG. 1 is a block diagram illustrating the basic structure of a typical prior-art switch driver.
Figure 2:
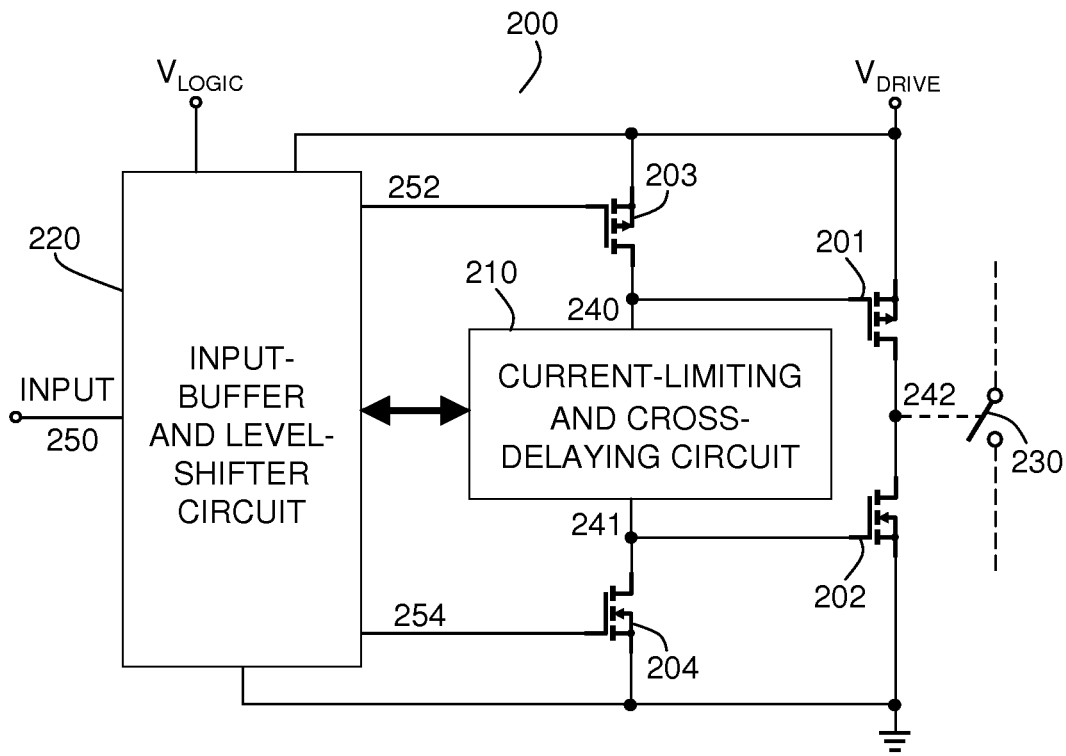
FIG. 2 is a block diagram illustrating the basic structure of a switch driver with a low-cost cross-conduction-preventing circuit, in accordance with one embodiment of the invention.

In one embodiment of the invention, as illustrated in FIG. 2, a driver 200 for a power transistor switch 230 comprises: a first p-channel FET 201 including a gate terminal, a source terminal, and a drain terminal, wherein the source terminal is coupled to an output-drive power supply $V_{DRIVE}$; a first n-channel FET 202 including a gate terminal, a source terminal, and a drain terminal, wherein the source terminal is coupled to a ground potential relative to the $V_{DRIVE}$, and wherein the drain terminal is coupled to the drain terminal of the first p-channel FET 201 thereby forming a complementary output node 242 which is operable to be coupled to drive the power transistor switch 230 (via an optional gate resistor (not shown), if it is necessary to reduce ringing introduced by parasitic lead inductance); a second p-channel FET 203 including a gate terminal, a source terminal, and a drain terminal, wherein the source terminal and the drain terminal are respectively coupled to the source terminal and the gate terminal of the first p-channel FET 201; a second n-channel FET 204 including a gate terminal, a source terminal, and a drain terminal, wherein the source terminal and the drain terminal are respectively coupled to the source terminal and the gate terminal of the first n-channel FET 202; a current-limiting and cross-delaying circuit 210 including a first node 240 and a second node 241, further comprising at least one resistor, and wherein the first node 240 is coupled to the drain terminal of the second p-channel FET 203, and wherein the second node 241 is coupled to the drain terminal of the second n-channel FET 204, to reduce current flowing from the first node 240 to the second node 241 thereby limiting shoot-through current when both the second p-channel FET 203 and the second n-channel FET 204 are momentarily turned on during a switching transition, and delaying turning on the first p-channel FET 201 when the first n-channel FET 202 is being turned off, and delaying turning on the first n-channel FET 202 when the first p-channel FET 201 is being turned off; and an input-buffer and level-shifter circuit 220, being powered by both a logic-voltage-level power supply $V_{LOGIC}$ and the $V_{DRIVE}$, to buffer and level-shift an external input signal at node 250 from $V_{LOGIC}$ level to $V_{DRIVE}$ level, with nodes 252 and 254 to be coupled to respectively drive the gate terminals of the second p-channel FET 203 and the second n-channel FET 204, and in conjunction with the current-limiting and cross-delaying circuit 210, to turn off the first p-channel FET 201 before turning on the first n-channel FET 202 thereby preventing cross conduction, and to turn off the first n-channel FET 202 before turning on the first p-channel FET 201 thereby preventing cross conduction.

After the second n-channel FET 204 is turned on, the first n-channel FET 202 is turned off; then the second p-channel FET 203 is turned off leaving its drain terminal floating; then the first node 240 of the current-limiting and cross-delaying circuit 210 starts to pull down the gate voltage of the first p-channel FET 201 toward ground potential until the first p-channel FET 201 is turned on, thereby sourcing $V_{DRIVE}$ to the complementary output node 242. Likewise, after the second p-channel FET 203 is turned on, the first p-channel FET 201 is turned off; then the second n-channel FET 204 is turned off leaving its drain terminal floating; then the second node 241 of the current-limiting and cross-delaying circuit 210 starts to pull up the gate voltage of the first n-channel FET 202 toward $V_{DRIVE}$ until the first n-channel FET 202 is turned on, thereby sinking the complementary output node 242 to ground potential.

In one embodiment, both the $V_{DRIVE}$ and the $V_{LOGIC}$ are respectively coupled to bypass capacitors (not shown) to work with peak switching currents. $V_{LOGIC}$ may be provided externally or be generated from $V_{DRIVE}$ via a voltage regulator or a Zener diode (not shown). The second p-channel FET 203 and the second n-channel FET 204 essentially form a complementary pre-driver with the current-limiting and cross-delaying circuit 210 inserted in between their drain terminals; and they are preferably designed to be respectively smaller than the first p-channel FET 201 and the first n-channel FET 202, and subsequently have respectively larger drain-to-source turn-on resistances. The gate-to-source voltage ratings of the first p-channel FET 201 and the second n-channel FET 202 should be higher than $V_{DRIVE}$; and subsequently, the maximum $V_{DRIVE}$ is limited by these gate-to-source voltage ratings. The larger the resistance of the resistor of the current-limiting and cross-delaying circuit 210, the more delay the current-limiting and cross-delaying circuit 210 can cause for turning on the first p-channel FET 201 or the first n-channel FET 202. In various embodiments, instead of driving a single power transistor switch, the driver 200 drives a plurality of power transistor switches simultaneously (not shown), or drives some other equivalent capacitive load (e.g., a digital bus line, or an equivalent load).

Figure 3:
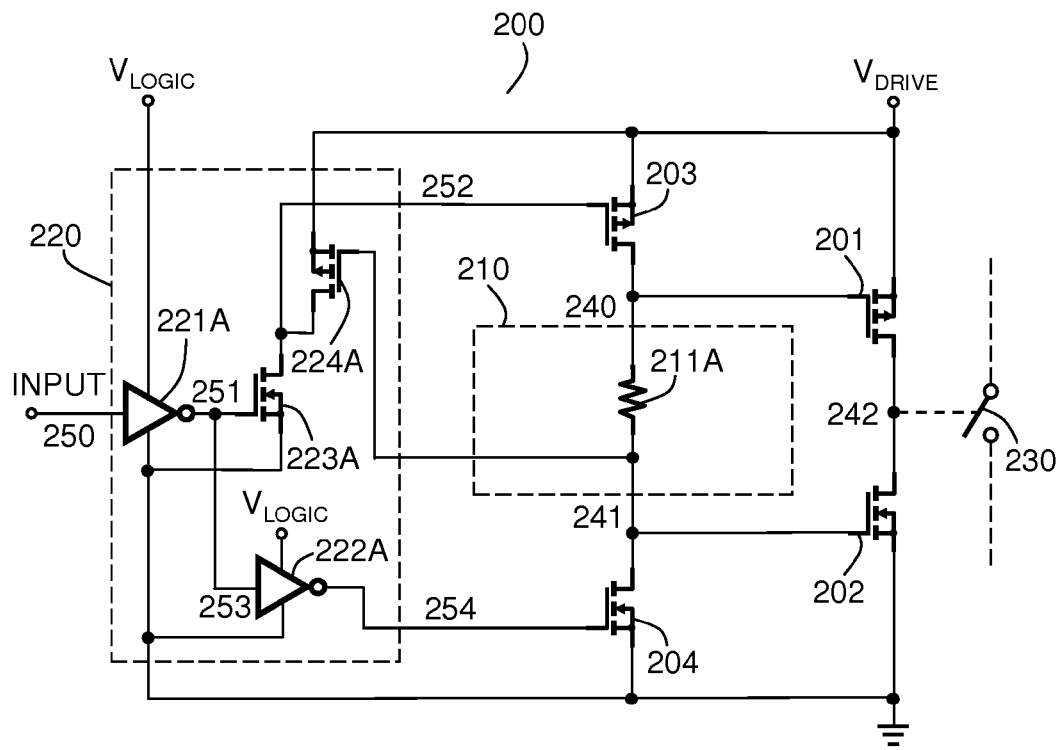
FIG. 3, derived from FIG. 2, illustrates a current-limiting and cross-delaying circuit, and an input-buffer and level-shifter circuit, in accordance with one embodiment of the invention.

FIG. 3 illustrates a basic embodiment of the current-limiting and cross-delaying circuit 210 comprising: a resistor 211A, including two terminals respectively coupled to the first node 240 and the second node 241 of the current-limiting and cross-delaying circuit 210. This embodiment is one of the most basic, simplest, and still highly efficient implementations of the current-limiting and cross-delaying circuit 210. The resistor 211A essentially forms a resistive-capacitive (RC) delay circuit with either the gate capacitance of the first p-channel FET 201 or the gate capacitance of the first n-channel FET 202.

During a switching transition, when both the second p-channel FET 203 and the second n-channel FET 204 are momentarily turned on, and after discharging the input capacitances of the first p-channel FET 201 and the first n-channel FET 202 as much as possible, the drain-to-source turn-on resistance of the second p-channel FET 203, and the drain-to-source turn-on resistance of the second n-channel FET 204, and the resistor 211A essentially form a virtual voltage divider across the $V_{DRIVE}$ and the ground potential. In one embodiment, this virtual voltage divider is designed to maintain the following mathematical relationships in order to prevent cross conduction at the complementary output: the source-to-drain voltage drop of the second p-channel FET 203 is preferably smaller than the absolute value of the gate threshold voltage of the first p-channel FET 201; and the drain-to-source voltage drop of the second n-channel FET 204 is preferably adapted to be smaller than the gate threshold voltage of the first n-channel FET 202. These are illustrated respectively by the following equations (1) and (2):

$$V_{DS\_203} = \frac{V_{DRIVE} R_{DS\_203}}{R_{DS\_203} + R_{211A} + R_{DS\_204}} < |V_{GS\_TH\_201}| \quad (1)$$

Where $V_{SD\_203}$ is the source-to-drain voltage drop of the second p-channel FET 203; $R_{DS\_203}$ is the drain-to-source turn-on resistance of the second p-channel FET 203; $R_{211A}$ is the resistance of the resistor 211A; $R_{DS\_204}$ is the drain-to-source turn-on resistance of the second n-channel FET 204; and $V_{GS\_TH\_201}$ is the gate threshold voltage of the first p-channel FET 201 and is always negative. And $$V_{DS\_204} = \frac{V_{DRIVE} R_{DS\_204}}{R_{DS\_203} + R_{211A} + R_{DS\_204}} < |V_{GS\_TH\_202}| \quad (2)$$

Where $V_{DS\_204}$ is the drain-to-source voltage drop of the second n-channel FET 204; and $V_{GS\_TH\_202}$ is the gate threshold voltage of the first n-channel FET 202.

Because the drain-to-source turn-on resistance of a FET tends to exhibit a positive temperature coefficient (i.e., the higher the junction temperature, the higher the drain-to-source turn-on resistance), and because both $V_{SD\_203}$ and $V_{DS\_204}$ are proportional to $V_{DRIVE}$, to partially compensate for changes of $V_{SD\_103}$ and $V_{DS\_104}$ with respect to changes of junction temperature or $V_{DRIVE}$, in one embodiment of the invention, the resistor 211A possesses both a positive temperature coefficient and a positive voltage coefficient (i.e., the higher the voltage drop across the resistor 211A, the higher the resistance of the resistor 211A). As an example, an n-well resistor is one type of resistor that exhibits both a positive temperature coefficient and a positive voltage coefficient.

There are many possible design embodiments of a functioning input-buffer and level-shifter circuit 220. In addition to the embodiment of the current-limiting and cross-delaying circuit 210, FIG. 3 also illustrates an embodiment of the input-buffer and level-shifter circuit 220 comprising: a third p-channel FET 224A including a gate terminal, a source terminal, and a drain terminal, wherein the source terminal is coupled to the $V_{DRIVE}$, and wherein the drain terminal is coupled to the gate terminal of the second p-channel FET 203 (thereby forming the node 252), and wherein the gate terminal is coupled to the second node 241 of the current-limiting and cross-delaying circuit 210; a third n-channel FET 223A including a gate terminal, a source terminal, and a drain terminal, wherein the drain terminal is coupled to the drain terminal of the third p-channel FET 224A, and wherein the source terminal is coupled to the ground potential; an input buffer 221A, being either inverting or non-inverting (FIG. 3 illustrates an inverting buffer even though a non-inverting buffer would also be feasible in another embodiment), and being powered by the $V_{LOGIC}$, and including an input terminal coupled to the external input signal at node 250, and including an output terminal 251 coupled to the gate terminal of the third n-channel FET 223A; an inverter 222A, being powered by the $V_{LOGIC}$, and including an input terminal 253 coupled to the output terminal 251 of the input buffer 221A, and including an output terminal coupled to the gate terminal of the second n-channel FET 204 (thereby forming the node 254).

When both the third p-channel FET 224A and the third n-channel FET 223A are turned on, the drain-to-source turn-on resistances of both FETs essentially form another virtual voltage divider across the $V_{DRIVE}$ and the ground potential, and in one embodiment, these FETs are adapted to be in an appropriate ratio to enable reliably turning ON/OFF the second p-channel FET 203 within the entire operating $V_{DRIVE}$ range. In one embodiment, the combined drain-to-source resistances of both FETs are adapted to be sufficiently large to limit current flowing from the $V_{DRIVE}$ to the ground potential.

Figure 11:
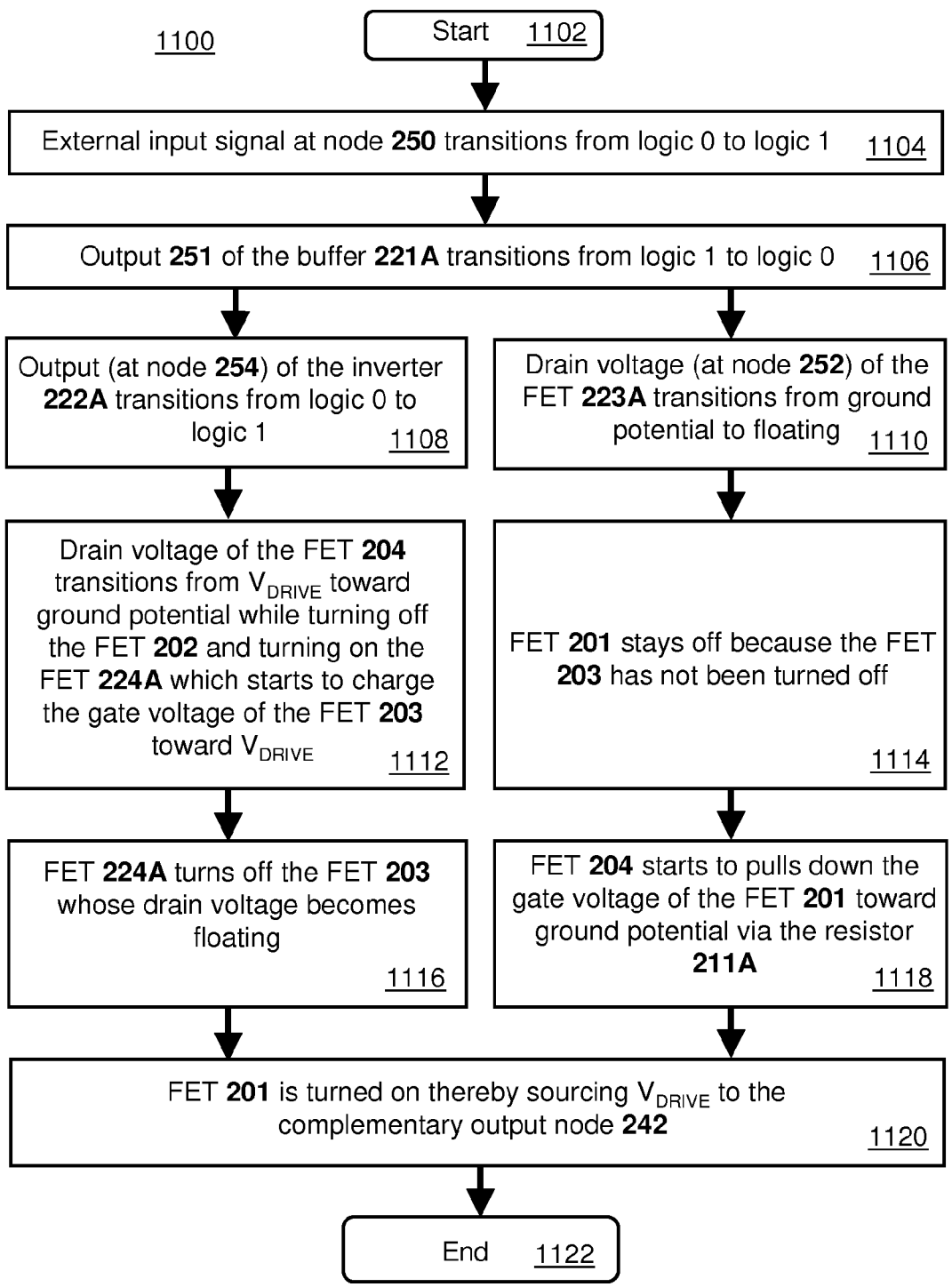
FIG. 11, assisting in understanding

To assist in understanding FIG. 3, FIG. 11 illustrates a 0-to-1 switching process 1100 starting in step 1102. In step 1104, the external input signal at node 250 transitions from logic 0 to logic 1. In step 1106, the output 251 of the buffer 221A transitions from logic 1 to logic 0. In step 1108, the output (at node 254) of the inverter 222A transitions from logic 0 to logic 1; while approximately concurrent to step 1108, in step 1110, the drain voltage (at node 252) of the third n-channel FET 223A transitions from ground potential to floating. In step 1112, the drain voltage of the second n-channel FET 204 transitions from $V_{DRIVE}$ toward ground potential while turning off the first n-channel FET 202 and turning on the third p-channel FET 224A which starts to charge the gate voltage of the second p-channel FET 203 toward $V_{DRIVE}$; while approximately concurrent to step 1112, in step 1114, the first p-channel FET 201 stays off because the second p-channel FET 203 has not been turned off. In step 1116, the third p-channel FET 224A turns off the second p-channel FET 203 whose drain voltage becomes floating; while approximately concurrent to step 1116, in step 1118, the drain terminal of second n-channel FET 204 starts to pulls down the gate voltage of the first p-channel FET 201 toward ground potential via the resistor 211A. In step 1120, the first p-channel FET 201 is turned on thereby sourcing $V_{DRIVE}$ to the complementary output node 242. And the 0-to-1 switching process 1100 ends in step 1122.

Figure 12:
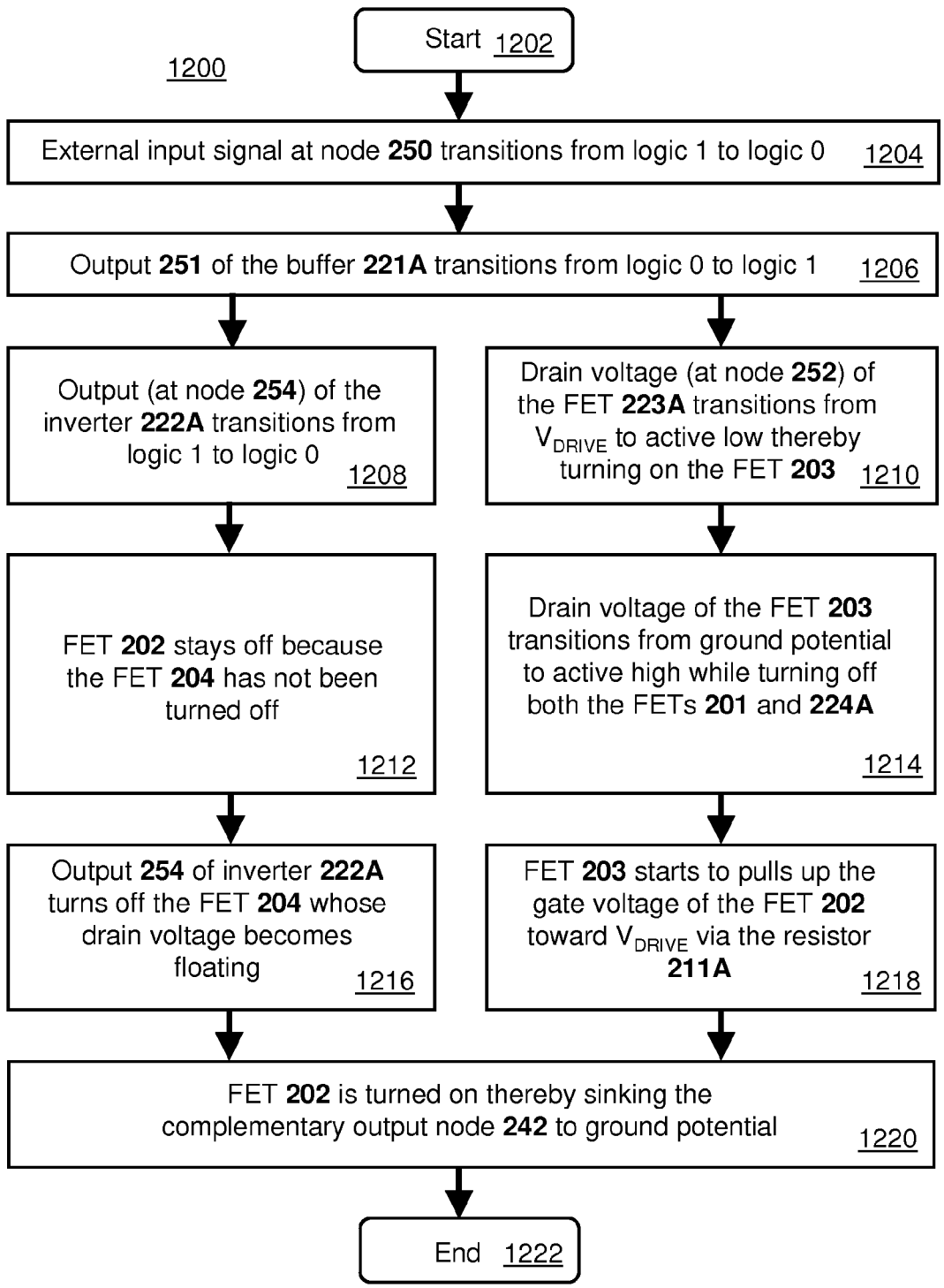
FIG. 12, assisting in understanding

To further assist in understanding FIG. 3, FIG. 12 illustrates a 1-to-0 switching process 1200 starting in step 1202. In step 1204, the external input signal at node 250 transitions from logic 1 to logic 0. In step 1206, the output 251 of the buffer 221A transitions from logic 0 to logic 1. In step 1208, the output (at node 254) of the inverter 222A transitions from logic 1 to logic 0; while approximately concurrent to step 1208, in step 1210, the drain voltage (at node 252) of the third n-channel FET 223A transitions from $V_{DRIVE}$ to active low thereby turning on the second p-channel FET 203. In step 1212, the first n-channel FET 202 stays off because the second n-channel FET 204 has not been turned off; while approximately concurrent to step 1212, in step 1214, the drain voltage of the second p-channel FET 203 transitions from ground potential to active high while turning off both the first p-channel FET 201 and the third p-channel FET 224A. In step 1216, the output 254 of inverter 222A turns off the second n-channel FET 204 whose drain voltage becomes floating; while approximately concurrent to step 1216, in step 1218, the second p-channel FET 203 starts to pull up the gate voltage of the first n-channel FET 202 toward $V_{DRIVE}$ via the resistor 211A. In step 1220, the first n-channel FET 202 is turned on thereby sinking the complementary output node 242 to ground potential. And the 1-to-0 switching process 1200 ends in step 1222.

Since when the external input signal at node 250 transitions from logic 0 to logic 1, the complementary output node 242 transitions from ground potential to $V_{DRIVE}$, the driver illustrated in FIG. 3 is constructed in a non-inverting configuration. In contrast, if the buffer 221A is constructed as a non-inverting buffer in another embodiment, the driver 200 is constructed in an inverting configuration instead.

The resistor 211A can be fabricated in any one of many feasible ways including utilizing the drain-to-source turn-on resistance of a FET. In addition to the resistor 211A, the current-limiting and cross-delaying circuit 210 may optionally comprise any combination of the following: a single resistor or a plurality of resistors; a single diode or a plurality of diodes; and a single transistor or a plurality of transistors. These are explained in the following sections.

Figure 4:
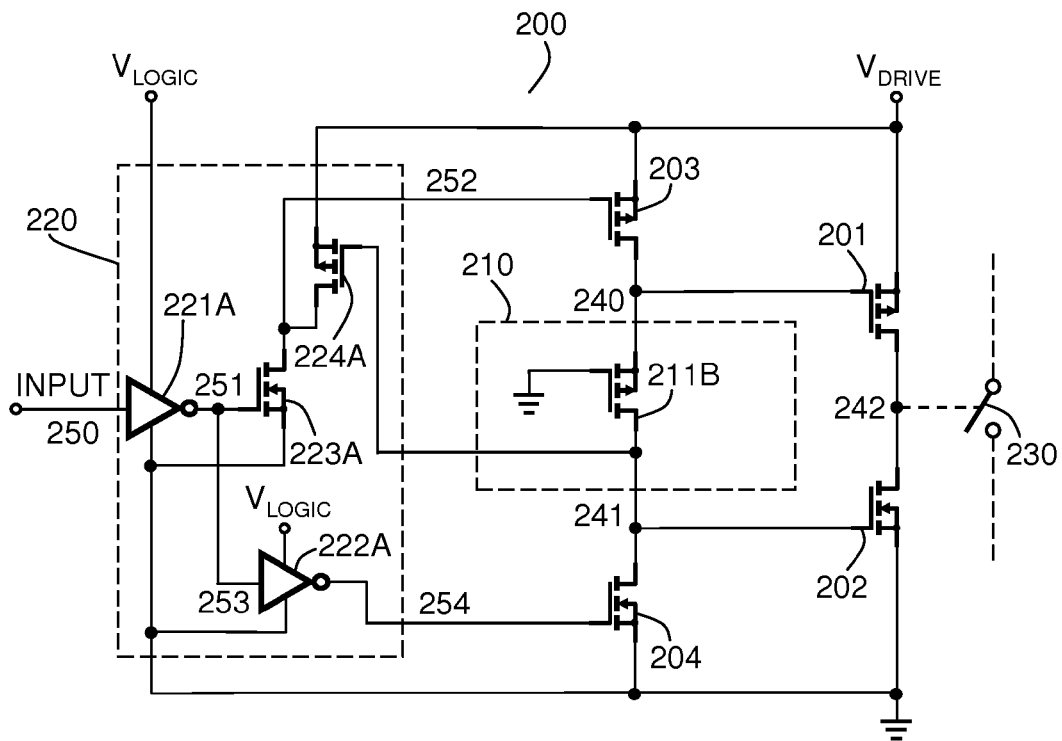
FIG. 4, derived from FIG. 3, illustrates another current-limiting and cross-delaying circuit in conjunction with the input-buffer and level-shifter circuit, in accordance with one embodiment of the invention.

FIG. 4, essentially identical to FIG. 3 except that the fabrication of a resistor differs, illustrates another embodiment of the current-limiting and cross-delaying circuit 210 comprising: a p-channel FET 211B, including a gate terminal coupled to the ground potential, and including a source terminal and a drain terminal respectively coupled to the first node 240 and the second node 241 of the current-limiting and cross-delaying circuit 210. The second node 241 of the current-limiting and cross-delaying circuit 210 is still coupled to the gate terminal of the third p-channel FET 224A in the input-buffer and level-shifter circuit 220. When the source voltage of the FET 211B exceeds the corresponding gate threshold voltage, the FET 211B is turned on and the drain-to-source turn-on resistance becomes an effective replacement for the resistor 211A in FIG. 3. The advantages of this embodiment over the embodiment illustrated in FIG. 3 include easier fabrication of a FET versus fabrication of a resistor on an IC, and a positive temperature coefficient of the drain-to-source turn-on resistance of the FET 211B. The disadvantages of this embodiment over the embodiment illustrated in FIG. 3 include not being able to pull down the gate voltage of the first p-channel FET 201 to ground potential because of the limitation of the gate threshold voltage of the FET 211B, and a negative voltage coefficient of the drain-to-source turn-on resistance of the FET 211B.

Figure 5:
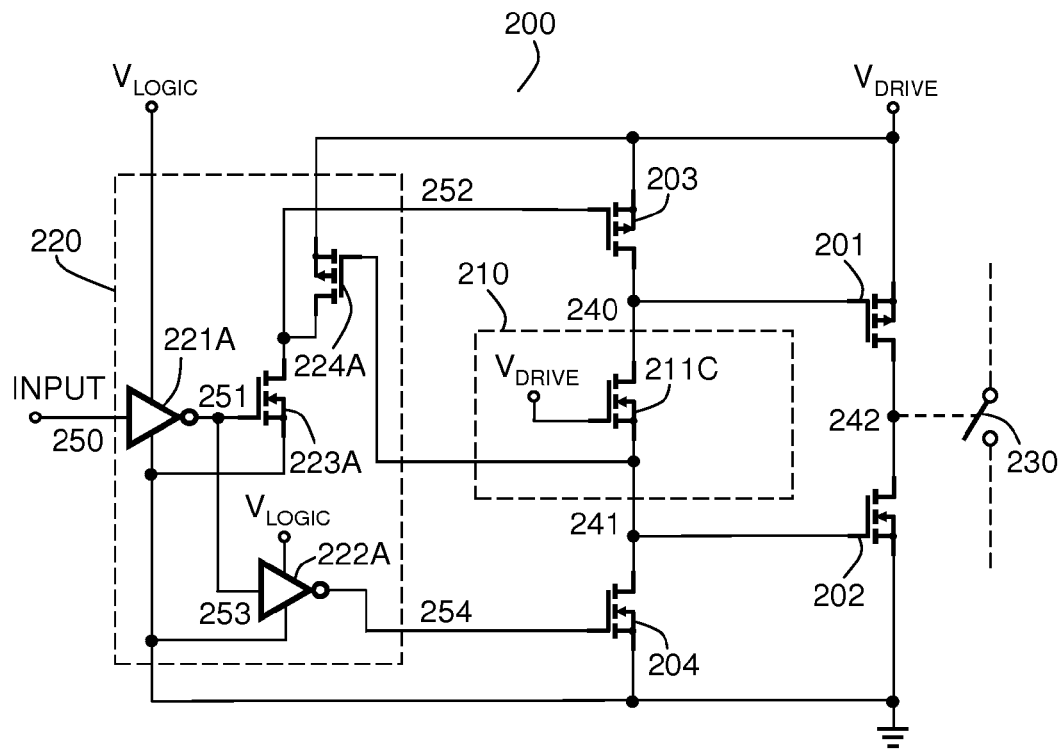
FIG. 5, derived from FIG. 3, illustrates still another current-limiting and cross-delaying circuit in conjunction with the input-buffer and level-shifter circuit, in accordance with one embodiment of the invention.

As an alternative to the embodiment illustrated in FIG. 4, FIG. 5, essentially identical to FIG. 3 except that the fabrication of a resistor differs, illustrates another embodiment of the current-limiting and cross-delaying circuit 210 comprising: an n-channel FET 211C, including a gate terminal coupled to the $V_{DRIVE}$, and including a drain terminal and a source terminal respectively coupled to the first node 240 and the second node 241 of the current-limiting and cross-delaying circuit 210. The second node 241 of the current-limiting and cross-delaying circuit 210 is still coupled to the gate terminal of the third p-channel FET 224A in the input-buffer and level-shifter circuit 220. When the source voltage of the FET 211C drops below $V_{DRIVE}$ by an amount equal to the corresponding gate threshold voltage, the FET 211C is turned on and the drain-to-source turn-on resistance becomes an effective replacement for the resistor 211A in FIG. 3. The advantages of this embodiment over the embodiment illustrated in FIG. 3 include easier fabrication of a FET versus fabrication of a resistor on an IC, and a positive temperature coefficient of the drain-to-source turn-on resistance of the FET 211C. The disadvantages of this embodiment over the embodiment illustrated in FIG. 3 include not being able to pull up the gate voltage of the first n-channel FET 202 to $V_{DRIVE}$ because of the limitation of the gate threshold voltage of the FET 211C, and a negative voltage coefficient of the drain-to-source turn-on resistance of the FET 211C.

Figure 6:
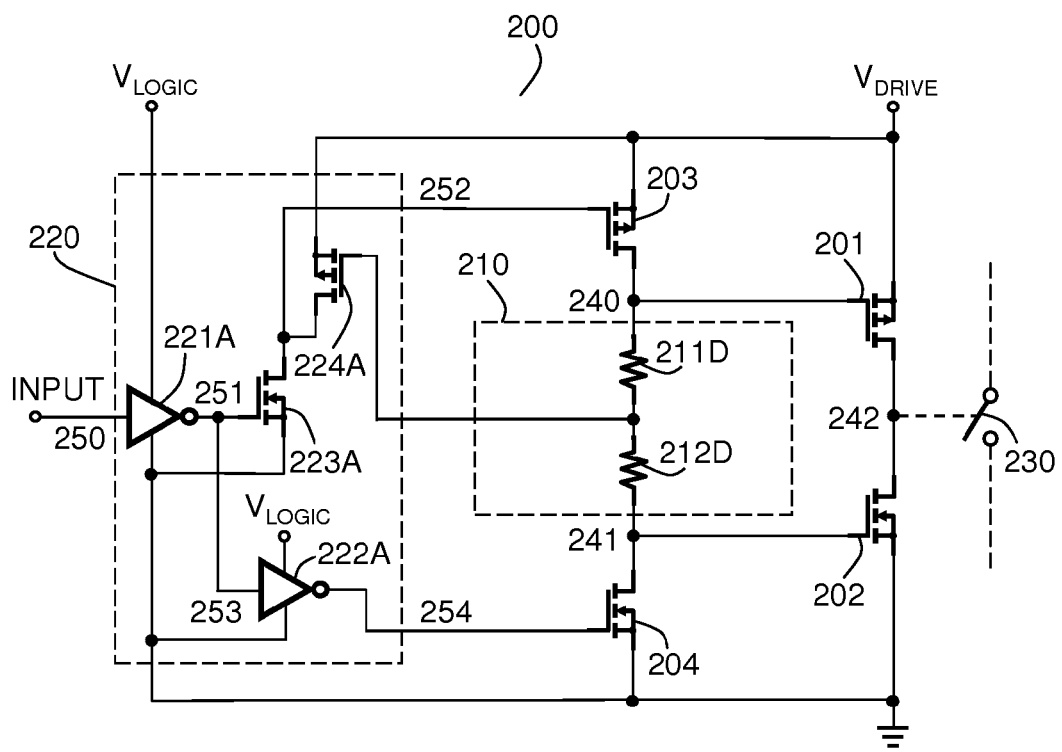
FIG. 6, derived from FIG. 3, illustrates still another current-limiting and cross-delaying circuit in conjunction with the input-buffer and level-shifter circuit, in accordance with one embodiment of the invention.

FIG. 6 is essentially identical to FIG. 3 except that it illustrates still another embodiment of the current-limiting and cross-delaying circuit 210 comprising: an upper resistor 2110, including a first terminal coupled to the first node 240 of the current-limiting and cross-delaying circuit 210, and including a second terminal coupled to the gate terminal of the third p-channel FET 224A in the input-buffer and level-shifter circuit 220; a lower resistor 2120, including a first terminal coupled to the second terminal of the upper resistor 2110, and including a second terminal coupled to the second node 241 of the current-limiting and cross-delaying circuit 210. Assuming the combined resistance of the upper resistor 2110 and the lower resistor 2120 is equal to the resistance of the resistor 211A in FIG. 3, the advantages of this embodiment over the embodiment illustrated in FIG. 3 include faster turning off of the third p-channel FET 224A, and faster turning off of the first n-channel FET 202. The disadvantages of this embodiment over the embodiment illustrated in FIG. 3 include slower turning on of the third p-channel FET 224A, and the extra cost to fabricate one more resistor.

Figure 7:
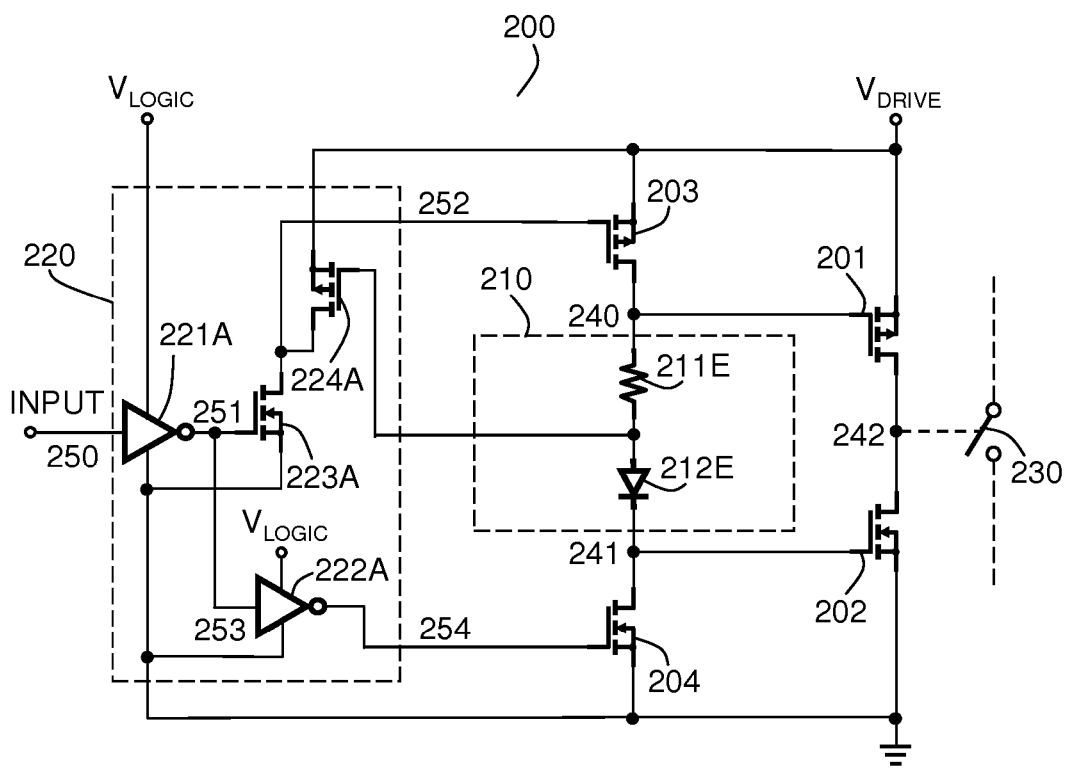
FIG. 7, derived from FIG. 3, illustrates still another current-limiting and cross-delaying circuit in conjunction with the input-buffer and level-shifter circuit, in accordance with one embodiment of the invention.

FIG. 7 is essentially identical to FIG. 3 except that it illustrates still another embodiment of the current-limiting and cross-delaying circuit 210 comprising: an upper resistor 211E, including a first terminal coupled to the first node 240 of the current-limiting and cross-delaying circuit 210, and including a second terminal coupled to the gate terminal of the third p-channel FET 224A in the input-buffer and level-shifter circuit 220; a lower diode 212E, including an anode coupled to the second terminal of the upper resistor 211E, and including a cathode coupled to the second node 241 of the current-limiting and cross-delaying circuit 210. The advantages of this embodiment over the embodiment illustrated in FIG. 3 include faster turning off of the third p-channel FET 224A, and faster turning off of the first n-channel FET 202. The disadvantages of this embodiment over the embodiment illustrated in FIG. 3 include slower turning on of the third p-channel FET 224A, and the extra cost to fabricate a diode.

Figure 8:
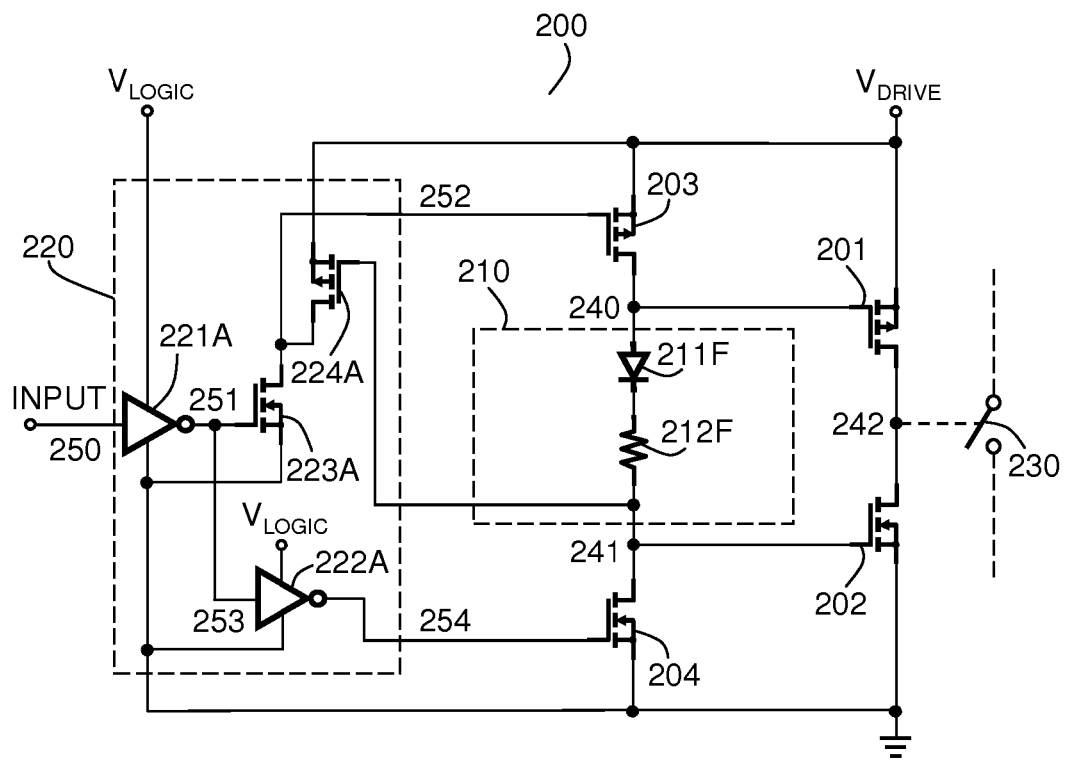
FIG. 8, derived from FIG. 3, illustrates still another current-limiting and cross-delaying circuit in conjunction with the input-buffer and level-shifter circuit, in accordance with one embodiment of the invention.

FIG. 8 is essentially identical to FIG. 3 except that it illustrates still another embodiment of the current-limiting and cross-delaying circuit 210 comprising: an upper diode 211F, including an anode coupled to the first node 240 of the current-limiting and cross-delaying circuit 210; a lower resistor 212F, including a first terminal coupled to a cathode of the upper diode 211F, and including a second terminal coupled to the gate terminal of the third p-channel FET 224A and to the second node 241 of the current-limiting and cross-delaying circuit 210. Assuming that the resistance of the lower resistor 212F is equal to the resistance of the resistor 211A in FIG. 3, the advantages of this embodiment over the embodiment illustrated in FIG. 3 include longer delay to turn on the first p-channel FET 201 or the first n-channel FET 202, and better current-limiting when both the second p-channel FET 203 and the second n-channel FET 204 are momentarily turned on during a switching transition. The disadvantages of this embodiment over the embodiment illustrated in FIG. 3 include longer switching propagation delays, and the extra cost to fabricate a diode.

Figure 9:
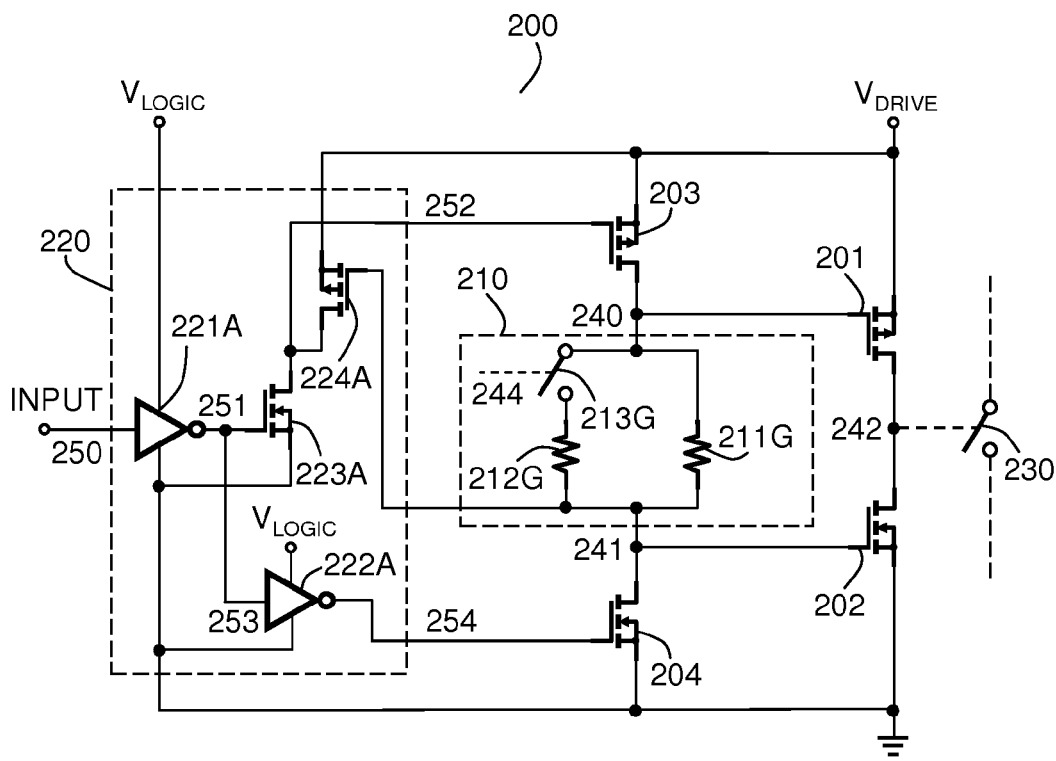
FIG. 9, derived from FIG. 3, illustrates still another current-limiting and cross-delaying circuit in conjunction with the input-buffer and level-shifter circuit, in accordance with one embodiment of the invention.

FIG. 9 is essentially identical to FIG. 3 except that it illustrates still another embodiment of the current-limiting and cross-delaying circuit 210 comprising: a resistor 211G, including a first terminal and a second terminal respectively coupled to the first node 240 and the second node 241 of the current-limiting and cross-delaying circuit 210; another resistor 212G, including a second terminal coupled to the second terminal of the resistor 211G; and a switch 213G, including a first terminal coupled to the first terminal of the resistor 211G, and including a second terminal coupled to a first terminal of the resistor 212G, and including a control terminal 244 via which the switch 213G is operable to be turned on by the driver 200 when $V_{DRIVE}$ drops below a pre-determined voltage threshold, thereby paralleling both the resistors 211G and 212G to reduce the overall resistance across the first node 240 and the second node 241 of the current-limiting and cross-delaying circuit 210. The advantages of this embodiment over the embodiment illustrated in FIG. 3 include shorter propagation delays when $V_{DRIVE}$ drops below the pre-determined voltage threshold. The disadvantages of this embodiment over the embodiment illustrated in FIG. 3 include the extra cost and the extra complexity to fabricate one more resistor and a switch plus related voltage reference and control logic.

Figure 10:
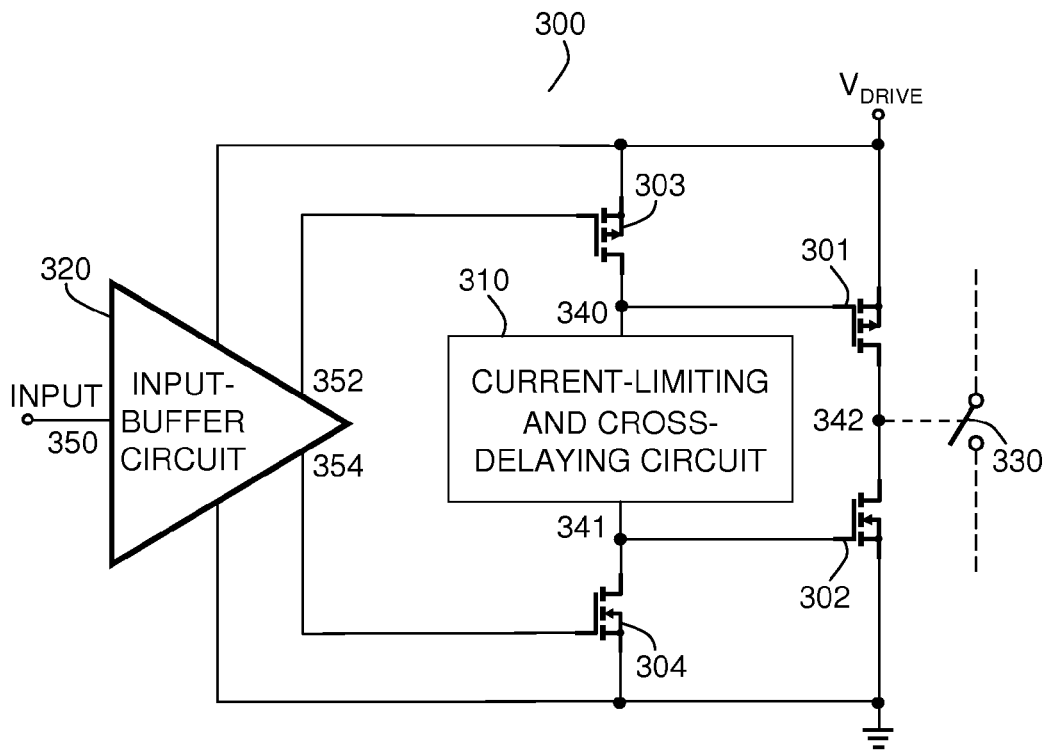
FIG. 10 is a block diagram illustrating the basic structure of a switch driver with a low-cost cross-conduction-preventing circuit, if level-shifting is unnecessary, in accordance with another embodiment of the invention.

If $V_{DRIVE}$ is equal to $V_{LOGIC}$, level-shifting is unnecessary. This may happen when $V_{DRIVE}$ is also at logic voltage level, or when the external input signal has been level-shifted to $V_{DRIVE}$ level in a pre-switch-driver circuit, or in any other possible scenario. Therefore, in another embodiment of the invention, as illustrated in FIG. 10, a driver 300 for a power transistor switch 330 comprises: a first p-channel FET 301 including a gate terminal, a source terminal, and a drain terminal, wherein the source terminal is coupled to an output-drive power supply $V_{DRIVE}$; a first n-channel FET 302 including a gate terminal, a source terminal, and a drain terminal, wherein the source terminal coupled to a ground potential relative to the $V_{DRIVE}$, and wherein the drain terminal is coupled to the drain terminal of the first p-channel FET 301 thereby forming a complementary output node 342 which is operable to be coupled to drive the power transistor switch 330 (in one embodiment via a gate resistor (not shown) if it is necessary to reduce ringing introduced by parasitic lead inductance); a second p-channel FET 303 including a gate terminal, a source terminal, and a drain terminal, wherein the source terminal and the drain terminal are respectively coupled to the source terminal and the gate terminal of the first p-channel FET 301; a second n-channel FET 304 including a gate terminal, a source terminal, and a drain terminal, wherein the source terminal and the drain terminal are respectively coupled to the source terminal and the gate terminal of the first n-channel FET 302; a current-limiting and cross-delaying circuit 310 including a first node 340 and a second node 341, further comprising at least one resistor, and wherein the first node 340 is coupled to the drain terminal of the second p-channel FET 303, and wherein the second node 341 is coupled to the drain terminal of the second n-channel FET 304, to reduce current flowing from the first node 340 to the second node 341 thereby limiting shoot-through current when both the second p-channel FET 303 and the second n-channel FET 304 are momentarily turned on during a switch transition, and delaying turning on the first p-channel FET 301 when the first n-channel FET 302 is being turned off, and delaying turning on the first n-channel FET 302 when the first p-channel FET 301 is being turned off; and an input-buffer circuit 320, being powered by the $V_{DRIVE}$, to buffer and amplify an external input signal at node 350, and to be coupled via nodes 352 and 354 to drive the gate terminals of the second p-channel FET 303 and the second n-channel FET 304, and in a conjunction with the current-limiting and cross-delaying circuit 310, to turn off the first p-channel FET 301 before turning on the first n-channel FET 302 thereby preventing cross conduction, and to turn off the first n-channel FET 302 before turning on the first p-channel FET 301 thereby preventing cross conduction.

In one embodiment of the current-limiting and cross-delaying circuit 310, at least one resistor includes two terminals which are respectively coupled to the first node 340 and the second node 341 of the current-limiting and cross-delaying circuit 310. The at least one resistor can be fabricated in any one of many feasible ways including being fabricated as an n-well resistor. As an alternative, the at least one resistor may be fabricated as a p-channel FET including: a source terminal, being coupled to the drain terminal of the second p-channel FET 303; and a drain terminal, being coupled to the drain terminal of the second n-channel FET 304; and a gate terminal, being coupled to the ground potential. The at least one resistor may also be fabricated as an n-channel FET including: a drain terminal, being coupled to the drain terminal of the second p-channel FET 303; and a source terminal, being coupled to the drain terminal of the second n-channel FET 304; and a gate terminal, being coupled to the $V_{DRIVE}$.

In addition to the at least one resistor, the current-limiting and cross-delaying circuit 310 may optionally comprise any combination of the following: a single resistor or a plurality of resistors; a single diode or a plurality of diodes; and a single transistor or a plurality of transistors.

In one embodiment of the invention, instead of driving a single power transistor switch, the driver 300 can drive a plurality of power transistor switches simultaneously (not shown), or drive some other equivalent capacitive loads (e.g., a digital bus line or an equivalent).

Figure 13:
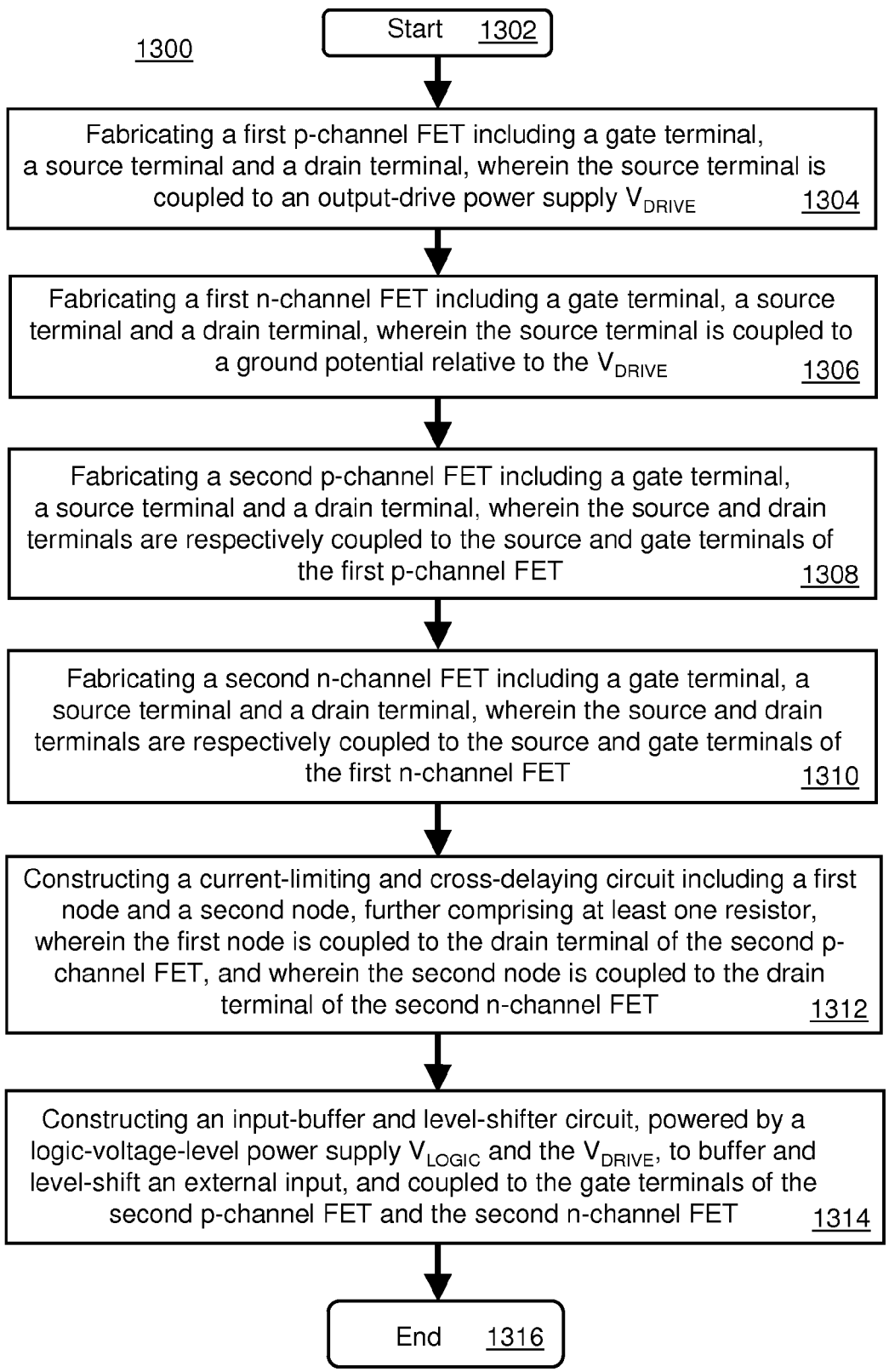
FIG. 13 illustrates a method to fabricate a switch driver circuit, in accordance with one embodiment of the invention.

FIG. 13 illustrates a method 1300 to fabricate a driver for a power transistor switch, in accordance with one embodiment of the invention. The method begins in operation 1302. Operation 1304 is next and includes fabricating a first p-channel FET including a gate terminal, a source terminal, and a drain terminal, wherein the source terminal is coupled to an output-drive power supply $V_{DRIVE}$. Operation 1306 is next and includes fabricating a first n-channel FET including a gate terminal, a source terminal, and a drain terminal, wherein the source terminal is coupled to a ground potential relative to the $V_{DRIVE}$, and wherein the drain terminal is coupled to the drain terminal of the first p-channel FET thereby forming a complementary output node which is operable to be coupled to drive the power transistor switch. Operation 1308 is next and includes fabricating a second p-channel FET including a gate terminal, a source terminal, and a drain terminal, wherein the source terminal and the drain terminal are respectively coupled to the source terminal and the gate terminal of the first p-channel FET. Operation 1310 is next and includes fabricating a second n-channel FET including a gate terminal, a source terminal, and a drain terminal, wherein the source terminal and the drain terminal are respectively coupled to the source terminal and the gate terminal of the first n-channel FET. Operation 1312 is next and includes constructing a current-limiting and cross-delaying circuit including a first node and a second node, further comprising at least one resistor, and wherein the first node is coupled to the drain terminal of the second p-channel FET, and wherein the second node is coupled to the drain terminal of the second n-channel FET, to reduce current flowing from the first node to the second node thereby limiting shoot-through current when both the second p-channel FET and the second n-channel FET are momentarily turned on during a switching transition, and delaying turning on the first p-channel FET when the first n-channel FET is being turned off, and delaying turning on the first n-channel FET when the first p-channel FET is being turned off. Operation 1314 is next and includes constructing an input-buffer and level-shifter circuit, being powered by both a logic-voltage-level power supply $V_{LOGIC}$ and the $V_{DRIVE}$, to buffer and level-shift an external input signal from $V_{LOGIC}$ level to $V_{DRIVE}$ level, and coupled to the gate terminals of the second p-channel FET and the second n-channel FET, and in conjunction with the current-limiting and cross-delaying circuit, to turn off the first p-channel FET before turning on the first n-channel FET thereby preventing cross conduction, and to turn off the first n-channel FET before turning on the first p-channel FET thereby preventing cross conduction. The method ends in operation 1316.

One method to construct the current-limiting and cross-delaying circuit includes fabricating at least one resistor to include two terminals which are respectively coupled to the first node and the second node of the current-limiting and cross-delaying circuit. One method is to fabricate the at least one resistor as turn-on drain-to-source resistance of a p-channel FET or an n-channel FET, or as an n-well resistor. One method to construct the current-limiting and cross-delaying circuit is, in addition to the at least one resistor, to comprise any combination of the following: a single resistor or a plurality of resistors; a single diode or a plurality of diodes; and a single transistor or a plurality of transistors.

One method to construct the input-buffer and level-shifter circuit comprises: fabricating a third p-channel FET including a gate terminal, a source terminal, and a drain terminal, wherein the source terminal is coupled to the $V_{DRIVE}$, and wherein the drain terminal is coupled to the gate terminal of the second p-channel FET, and wherein the gate terminal is coupled to the second node of the current-limiting and cross-delaying circuit; fabricating a third n-channel FET including a gate terminal, a source terminal, and a drain terminal, wherein the drain terminal is coupled to the drain terminal of the third p-channel FET, and wherein the source terminal is coupled to the ground potential; constructing an input buffer, being powered by the $V_{LOGIC}$, and including an input terminal coupled to the external input signal, and including an output terminal coupled to the gate terminal of the third n-channel FET; constructing an inverter, being powered by the $V_{LOGIC}$, and including an input terminal coupled to the output terminal of the input buffer, and including an output terminal coupled to the gate terminal of the second n-channel FET.

INDUSTRIAL APPLICABILITY

In view of the foregoing, the industrial applicability of the present invention is broad and can provide a low-cost and high-performing switch driver with a cross-conduction-preventing circuit. And because of its simplicity and ease of fabrication, a single switch driver or a plurality of such switch drivers can be integrated with other functions on a same IC. Applications of such a switch driver include switch-mode power supplies (SMPS), synchronous rectifier circuits, motor controls, digital bus line drivers, and so forth.

While the foregoing invention shows a number of illustrative and descriptive embodiments of the invention, it will be apparent to any person with ordinary skills in the area of technology related to the invention that various changes, modifications, substitutions and combinations can be made herein without departing from the scope or the spirit of the invention as defined by the following claims.

What is claimed:

1. A driver for a power transistor switch, comprising:
   a first p-channel FET including a gate terminal, a source terminal, and a drain terminal, wherein the source terminal is coupled to an output-drive power supply $V_{DRIVE}$;
   a first n-channel FET including a gate terminal, a source terminal, and a drain terminal, wherein the source terminal is coupled to a ground potential relative to the $V_{DRIVE}$, and wherein the drain terminal is coupled to the drain terminal of the first p-channel FET thereby forming a complementary output node which is operable to be coupled to drive the power transistor switch;
   a second p-channel FET including a gate terminal, a source terminal, and a drain terminal, wherein the source terminal and the drain terminal are respectively coupled to the source terminal and the gate terminal of the first p-channel FET;
   a second n-channel FET including a gate terminal, a source terminal, and a drain terminal, wherein the source terminal and the drain terminal are respectively coupled to the source terminal and the gate terminal of the first n-channel FET;
   a current-limiting and cross-delaying circuit including a first node and a second node, further comprising at least one resistor, and wherein the first node is coupled to the drain terminal of the second p-channel FET, and wherein the second node is coupled to the drain terminal of the second n-channel FET, to reduce current flowing from the first node to the second node thereby limiting shoot-through current when both the second p-channel FET and the second n-channel FET are momentarily turned on during a switching transition, and delaying turning on the first p-channel FET when the first n-channel FET is being turned off, and delaying turning on the first n-channel FET when the first p-channel FET is being turned off; and
   an input-buffer and level-shifter circuit, being powered by both a logic-voltage-level power supply $V_{LOGIC}$ and the $V_{DRIVE}$, to buffer and level-shift an external input signal from $V_{LOGIC}$ level to $V_{DRIVE}$ level, and coupled to drive the gate terminals of the second p-channel FET and the second n-channel FET, and in conjunction with the current-limiting and cross-delaying circuit, to turn off the first p-channel FET before turning on the first n-channel FET thereby preventing cross conduction, and to turn off the first n-channel FET before turning on the first p-channel FET thereby preventing cross conduction.

2. The driver of claim 1, wherein at least one resistor includes two terminals which are respectively coupled to the first node and the second node of the current-limiting and cross-delaying circuit.

3. The driver of claim 2, wherein the at least one resistor is fabricated as a p-channel FET including: a source terminal coupled to the drain terminal of the second p-channel FET; and a drain terminal coupled to the drain terminal of the second n-channel FET; and a gate terminal coupled to the ground potential.

4. The driver of claim 2, wherein the at least one resistor is fabricated as an n-channel FET including: a drain terminal coupled to the drain terminal of the second p-channel FET; and a source terminal coupled to the drain terminal of the second n-channel FET; and a gate terminal coupled to the $V_{DRIVE}$.

5. The driver of claim 1, wherein at least one resistor is fabricated as an n-well resistor.

6. The driver of claim 1, wherein in addition to the at least one resistor, the current-limiting and cross-delaying circuit comprises any combination of the following: a single resistor or a plurality of resistors; a single diode or a plurality of diodes; and a single transistor or a plurality of transistors.

7. The driver of claim 1, wherein the driver drives a plurality of power transistor switches simultaneously, or drives an equivalent capacitive load.

8. The driver of claim 1, wherein the input-buffer and level-shifter circuit further comprises:
   a third p-channel FET including a gate terminal, a source terminal, and a drain terminal, wherein the source terminal is coupled to the $V_{DRIVE}$, and wherein the drain terminal is coupled to the gate terminal of the second p-channel FET, and wherein the gate terminal is coupled to the second node of the current-limiting and cross-delaying circuit;
   a third n-channel FET including a gate terminal, a source terminal, and a drain terminal, wherein the drain terminal is coupled to the drain terminal of the third p-channel FET, and wherein the source terminal is coupled to the ground potential;
   an input buffer powered by the $V_{LOGIC}$, and including an input terminal coupled to the external input signal, and including an output terminal coupled to the gate terminal of the third n-channel FET; and an inverter powered by the $V_{LOGIC}$, and including an input terminal coupled to the output terminal of the input buffer, and including an output terminal coupled to the gate terminal of the second n-channel FET.

9. A driver for a power transistor switch, comprising:

a first p-channel FET including a gate terminal, a source terminal, and a drain terminal, wherein the source terminal is coupled to an output-drive power supply $V_{DRIVE}$;

a first n-channel FET including a gate terminal, a source terminal, and a drain terminal, wherein the source terminal is coupled to a ground potential relative to the $V_{DRIVE}$, and wherein the drain terminal is coupled to the drain terminal of the first p-channel FET thereby forming a complementary output node which is operable to be coupled to drive the power transistor switch;

a second p-channel FET including a gate terminal, a source terminal, and a drain terminal, wherein the source terminal and the drain terminal are respectively coupled to the source terminal and the gate terminal of the first p-channel FET;

a second n-channel FET including a gate terminal, a source terminal, and a drain terminal, wherein the source terminal and the drain terminal are respectively coupled to the source terminal and the gate terminal of the first n-channel FET;

a current-limiting and cross-delaying circuit including a first node and a second node, further comprising at least one resistor, and wherein the first node is coupled to the drain terminal of the second p-channel FET, and wherein the second node is coupled to the drain terminal of the second n-channel FET, to reduce current flowing from the first node to the second node thereby limiting shoot-through current when both the second p-channel FET and the second n-channel FET are momentarily turned on during a switching transition, and delaying turning on the first p-channel FET when the first n-channel FET is being turned off, and delaying turning on the first n-channel FET when the first p-channel FET is being turned off; and an input-buffer circuit, being powered by the $V_{DRIVE}$, to buffer and amplify an external input signal, and coupled to drive the gate terminals of the second p-channel FET and the second n-channel FET, and in conjunction with the current-limiting and cross-delaying circuit, to turn off the first p-channel FET before turning on the first n-channel FET thereby preventing cross conduction, and to turn off the first n-channel FET before turning on the first p-channel FET thereby preventing cross conduction.

10. The driver of claim 9, wherein at least one resistor includes two terminals which are respectively coupled to the first node and the second node of the current-limiting and cross-delaying circuit.

11. The driver of claim 10, wherein the at least one resistor is fabricated as a p-channel FET including: a source terminal coupled to the drain terminal of the second p-channel FET; and a drain terminal coupled to the drain terminal of the second n-channel FET; and a gate terminal coupled to the ground potential.

12. The driver of claim 10, wherein the at least one resistor is fabricated as an n-channel FET including: a drain terminal coupled to the drain terminal of the second p-channel FET; and a source terminal coupled to the drain terminal of the second n-channel FET; and a gate terminal coupled to the $V_{DRIVE}$.

13. The driver of claim 9, wherein at least one resistor is fabricated as an n-well resistor.

14. The driver of claim 9, wherein in addition to the at least one resistor, the current-limiting and cross-delaying circuit comprises any combination of the following: a single resistor or a plurality of resistors; a single diode or a plurality of diodes; and a single transistor or a plurality of transistors.

15. The driver of claim 9, wherein the driver drives a plurality of power transistor switches simultaneously, or drives an equivalent capacitive load.

16. A method for fabricating a driver for a power transistor switch, comprising:

fabricating a first p-channel FET including a gate terminal, a source terminal, and a drain terminal, wherein the source terminal is coupled to an output-drive power supply $V_{DRIVE}$;

fabricating a first n-channel FET including a gate terminal, a source terminal, and a drain terminal, wherein the source terminal is coupled to a ground potential relative to the $V_{DRIVE}$, and wherein the drain terminal is coupled to the drain terminal of the first p-channel FET thereby forming a complementary output node which is operable to be coupled to drive the power transistor switch;

fabricating a second p-channel FET including a gate terminal, a source terminal, and a drain terminal, wherein the source terminal and the drain terminal are respectively coupled to the source terminal and the gate terminal of the first p-channel FET;

fabricating a second n-channel FET including a gate terminal, a source terminal, and a drain terminal, wherein the source terminal and the drain terminal are respectively coupled to the source terminal and the gate terminal of the first n-channel FET;

constructing a current-limiting and cross-delaying circuit including a first node and a second node, further comprising at least one resistor, and wherein the first node is coupled to the drain terminal of the second p-channel FET, and wherein the second node is coupled to the drain terminal of the second n-channel FET, to reduce current flowing from the first node to the second node thereby limiting shoot-through current when both the second p-channel FET and the second n-channel FET are momentarily turned on during a switching transition, and delaying turning on the first p-channel FET when the first n-channel FET is being turned off, and delaying turning on the first n-channel FET when the first p-channel FET is being turned off; and constructing an input-buffer and level-shifter circuit, being powered by both a logic-voltage-level power supply $V_{LOGIC}$ and the $V_{DRIVE}$, to buffer and level-shift an external input signal from $V_{LOGIC}$ level to $V_{DRIVE}$ level, and coupled to drive the gate terminals of the second p-channel FET and the second n-channel FET, and in conjunction with the current-limiting and cross-delaying circuit, to turn off the first p-channel FET before turning on the first n-channel FET thereby preventing cross conduction, and to turn off the first n-channel FET before turning on the first p-channel FET thereby preventing cross conduction.

17. The method of claim 16, wherein constructing the current-limiting and cross-delaying circuit includes fabricating at least one resistor to include two terminals which are respectively coupled to the first node and the second node of the current-limiting and cross-delaying circuit.

18. The method of claim 17, wherein the at least one resistor is fabricated as turn-on drain-to-source resistance of a p-channel FET or an n-channel FET, or as an n-well resistor.

19. The method of claim 16, wherein in addition to the at least one resistor, the current-limiting and cross-delaying circuit is constructed to comprise any combination of the following: a single resistor or a plurality of resistors; a single diode or a plurality of diodes; and a single transistor or a plurality of transistors.

20. The method of claim 16, wherein constructing the input-buffer and level-shifter circuit comprises:
- fabricating a third p-channel FET including a gate terminal, a source terminal, and a drain terminal, wherein the source terminal is coupled to the $V_{DRIVE}$, and wherein the drain terminal is coupled to the gate terminal of the second p-channel FET, and wherein the gate terminal is coupled to the second node of the current-limiting and cross-delaying circuit;
- fabricating a third n-channel FET including a gate terminal, a source terminal, and a drain terminal, wherein the drain terminal is coupled to the drain terminal of the third p-channel FET, and wherein the source terminal coupled to the ground potential;
- constructing an input buffer, being powered by the $V_{LOGIC}$, and including an input terminal coupled to the external input signal, and including an output terminal coupled to the gate terminal of the third n-channel FET; and
- constructing an inverter, being powered by the $V_{LOGIC}$, and including an input terminal coupled to the output terminal of the input buffer, and including an output terminal coupled to the gate terminal of the second n-channel FET.

* * * * *